United States Patent
Fujisawa et al.

(10) Patent No.: US 6,498,714 B1
(45) Date of Patent: Dec. 24, 2002

(54) THIN FILM CAPACITANCE DEVICE AND PRINTED CIRCUIT BOARD

(75) Inventors: Akira Fujisawa, Nagano (JP); Akihito Takano, Nagano (JP); Masayuki Sasaki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/679,328

(22) Filed: Oct. 4, 2000

(30) Foreign Application Priority Data

Oct. 5, 1999 (JP) ............................................. 11-284493

(51) Int. Cl.[7] .............................................. H01G 4/228
(52) U.S. Cl. ................................ 361/306.3; 361/321.1; 361/313; 361/305; 361/321.4; 438/393; 438/394; 257/534
(58) Field of Search ............................... 361/306.3, 303, 361/305, 311, 321.5, 313, 321.2, 301.1, 321.4, 306.1, 301.2; 438/393, 394; 257/534

(56) References Cited

U.S. PATENT DOCUMENTS

| | | | | |
|---|---|---|---|---|
| 3,898,539 A | * | 8/1975 | Yoshimura et al. | ......... 317/230 |
| 5,035,939 A | * | 7/1991 | Conlon et al. | .............. 428/137 |
| 5,142,438 A | * | 8/1992 | Reinberg et al. | ............. 361/313 |
| 5,452,178 A | * | 9/1995 | Emesh et al. | ................. 361/303 |
| 5,685,968 A | * | 11/1997 | Hayakawa et al. | .......... 205/122 |
| 5,745,334 A | * | 4/1998 | Hoffarth et al. | ............. 361/313 |
| 5,814,849 A | * | 9/1998 | Azuma et al. | ............... 257/295 |
| 5,872,696 A | * | 2/1999 | Peters et al. | ................. 361/305 |
| 5,936,831 A | * | 8/1999 | Kola et al. | .................... 361/303 |
| 6,072,689 A | * | 6/2000 | Kirlin | ............................ 361/311 |
| 6,207,522 B1 | * | 3/2001 | Hunt et al. | .................. 438/393 |
| 6,320,244 B1 | * | 11/2001 | Alers et al. | .................. 257/534 |

FOREIGN PATENT DOCUMENTS

| | | |
|---|---|---|
| JP | 52-137665 | 11/1977 |
| JP | 6-252528 | 9/1994 |

* cited by examiner

Primary Examiner—Dean A. Reichard
Assistant Examiner—Ha T. Nguyen
(74) Attorney, Agent, or Firm—Paul & Paul

(57) ABSTRACT

The present invention relates to a thin film capacitor device having a copper wiring layer, a dielectric layer, and a barrier layer interposed between the wiring layer and the dielectric layer. The barrier layer has the function of preventing diffusion of copper of the wiring layer. The thin film capacitor device may also include an insulating substrate, a planarizing layer, an adhesion layer, and an intermediate layer. The present invention may also relate to a printed circuit substrate having the described thin film capacitor device built therein as a capacitor.

13 Claims, 8 Drawing Sheets

THIN FILM CAPACITANCE DEVICE AND PRINTED CIRCUIT BOARD

BACKGROUND OF THE INVENTION

1. Field of the Invention

This invention relates to a thin film capacitor device. More particularly, this invention relates to a tantalum-based thin film capacitor device having high performance and providing a high production yield. The present invention also relates to a printed circuit substrate in which such a thin film capacitor device is built as a capacitor, particularly a multi-layered circuit substrate.

2. Description of the Related Art

As is well known, a circuit construction in which a thin film of tantalum (Ta) is formed on a low resistance metal wire such as copper (Cu), the thin film is subjected to anodic oxidation in a suitable electrolyte to form a dielectric layer and the resulting capacitor device is built as a capacitor in a printed circuit substrate, has been employed extensively. To form a capacitor device using the Ta type thin film, for example, fabrication steps that will be explained serially with reference to FIGS. 1A to 1E are generally employed. First, to form a lower electrode made of Ta, a Ta thin film 112 is deposited to a film thickness of about 5,000 angstroms in such a manner as to cover the entire surface of an insulating substrate 111 as shown in FIG. 1A. The insulating substrate 111 may have a protective film on its surface. A sputtering process (hereinafter called also "sputtering"), for example, can be employed to form the Ta thin film 112. Next, as shown in FIG. 1B, the unnecessary portions of the Ta thin film 112 are patterned, peeled and removed. Next, as shown in FIG. 1C, a resist film 113 is deposited in such a manner as to expose only a dielectric layer formation region of the Ta thin film 112, and then anodic oxidation treatment (which is called also "anode formation") is conducted. To conduct this anodic oxidation treatment, the substrate 111 is immersed into a suitable electrolyte and a high voltage of about 280 V is generally applied. As a result, a dielectric layer 114 (comprising tantalum pentoxide $Ta_2O_5$) having a film thickness of about 4,500 angstroms is formed as shown in FIG. 1D. Subsequently, the resist film 113 that becomes unnecessary is peeled and removed, and an Au thin film 115 is formed to a film thickness of about 3,000 angstroms by a vacuum deposition process or a sputtering process to form an upper electrode made of gold (Au), for example, as shown in FIG. 1E. Nichrome (NiCr), for example, is preferably formed to a film thickness of about 300 angstroms before the formation of the Au thin film 115, though the NiCr film is not shown in the drawing. Incidentally, this drawing shows the state where the unnecessary portions of the Au thin film 115 are peeled and removed by patterning. There is thus obtained the Ta-based thin film capacitor device comprising the laminate structure of the Ta thin film (lower electrode) 112, $Ta_2O_5$ thin film (dielectric layer) 114, and NiCr/Au thin film (upper electrode) 115.

When the Ta-based thin film capacitor device is assembled into the substrate or wiring layer made of Cu, there is the tendency that the Cu ions diffuse into the Ta thin film and positively dissolve into the electrolyte during the anodic oxidation process. This tendency is important. When diffusion of the Cu ions occurs at the time of anodic oxidation, the voltage can be raised to only about 100 V at most as a result of dissolution of the Cu ions into the electrolyte, though the voltage should originally reach a high level (generally, 200 to 300 V). Thus, anodic oxidation cannot be conducted satisfactorily, and pin-holes, unevenness and breakage occur in the resulting anodic oxide film (dielectric layer). Since such defects occur very frequently, the reliability and the yield of the resulting capacitor device drop remarkably, and an increase in the leakage current is induced.

When the surface of the substrate used is coarse, a polyimide resin or an epoxy resin is applied by spin coating, etc., to the surface to planarize the surface, and is set. Thereafter, the Ta thin film is formed. Depending on the condition of anodic oxidation to be conducted subsequent to the formation of the Ta thin film, however, peeling of the Ta thin film occurs due to the stress of the resulting anodic oxide film.

SUMMARY OF THE INVENTION

It is an object of the present invention to provide an improved Ta-based thin film capacitor device that solves the problems of the prior art technologies described above, does not invite the drop of reliability and yield, an increase in the leakage current, peeling of the Ta thin film, etc., resulting from anodic oxidation employed during the production process, and has an extremely high adhesion strength between the Ta thin film and the substrate as the base.

It is another object of the present invention to provide a high-performance printed circuit substrate having the thin film capacitor device, provided by the present invention, built therein as a capacitor.

These and other objects of the present invention will be more easily understood from the following detailed description of the embodiments and examples thereof.

According to one aspect of the present invention, there is provided a thin film capacitor device comprising a substrate or wiring layer made of a copper-based low resistance metal, and a dielectric layer made of an anodic oxide of a tantalum-based metal formed on the substrate or the wiring layer, characterized in that a barrier layer comprising at least one kind of a valve metal selected from the group consisting of aluminum, tantalum, niobium, tungsten, molybdenum, vanadium, bismuth, titanium, zirconium, hafnium and silicon, a compound of the valve metal, a mixture of the valve metal compounds, a mixture of the valve metal compound and the valve metal, or an alloy of the valve metal, is interposed between the substrate or the wiring layer and the dielectric layer.

According to another aspect of the present invention, there is provided a printed circuit substrate, wherein the capacitor according to the present invention is built in as a capacitor.

DESCRIPTION OF THE PREFERRED EMBODIMENTS

The thin film capacitor according to the present invention is a thin film capacitor device that comprises a substrate or wiring layer made of a copper (Cu)-based low resistance metal and a dielectric layer made of a tantalum (Ta)-based anodic oxide and formed on the substrate or wiring layer. Here, the term "Cu-based low resistance metal" represents Cu alone or an alloy or a mixture consisting of Cu as its principal component. In this specification, these Cu-based metals are generically called "Cu". The term "Ta-based metal" represents Ta alone or an alloy or a mixture consisting of Ta as its principal component, such as TaN. In this specification, all these Ta-based metals are generically called "Ta", too. Furthermore, the term "thin film capacitor device" can be called also as the "capacitor".

It is the essential requirement in the capacitor device according to the present invention that a barrier layer is disposed on or over the Cu-based substrate or wiring layer either directly or through an arbitrary intermediate layer. The barrier layer has the function of preventing diffusion of Cu of the wiring layer, etc., as a lower layer into the Ta layer as the upper layer when the dielectric layer is formed by anodic oxidation of the Ta layer. Therefore, it can avoid a drop in reliability of the dielectric layer to be formed, and can prevent a drop in the yield of the capacitor device, as well as the circuit substrate with the built-in capacitor device, and an increase in the leakage current. Furthermore, the barrier layer remarkably improves adhesion power of the Ta layer to the substrate when it is disposed as the base of the Ta layer.

Figure 1A:
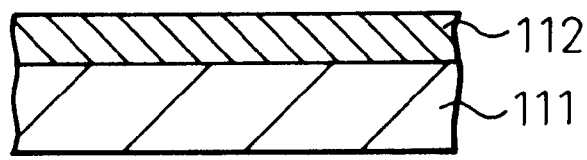
FIGS. 1A to 1E are sectional views showing, in sequence, a production process of a prior art Ta-based thin film capacitor device.
Figure 1B:
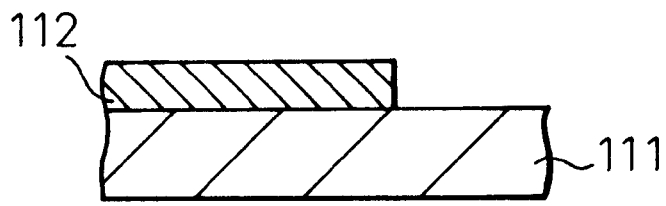
Figure 1C:
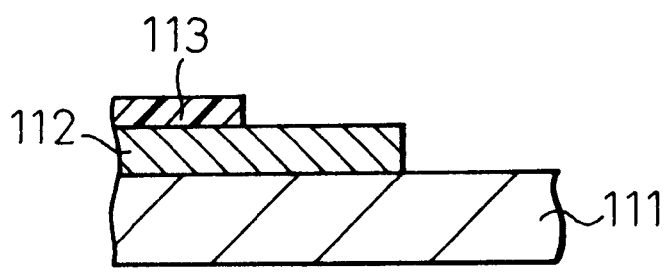
Figure 1D:
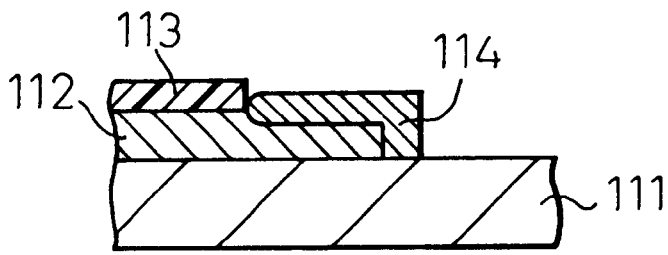
Figure 1E:
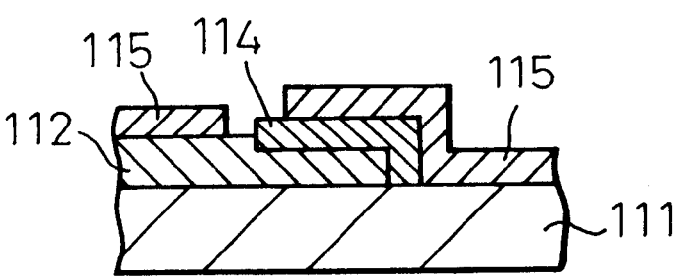
Figure 2:
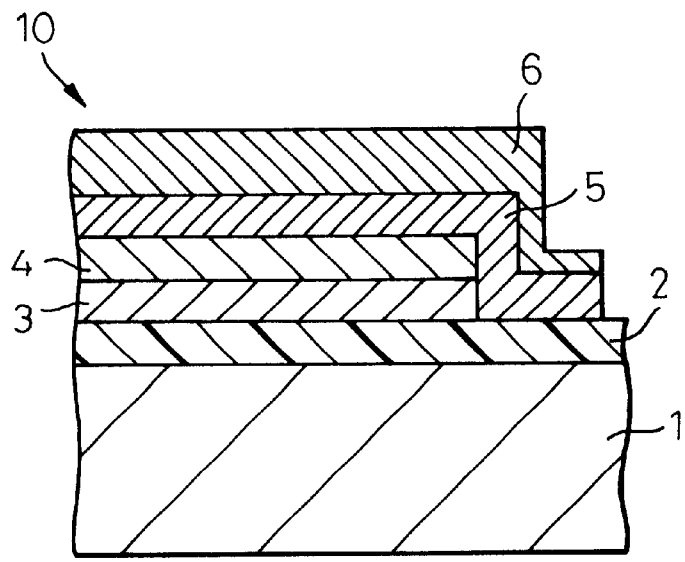
FIG. 2 is a sectional view showing the state of a Ta-based thin film capacitor device according to the present invention before anodic oxidation.

The thin film capacitor device according to the present invention can take various forms, and a typical example will be explained with reference to FIG. 2. Incidentally, FIG. 2 shows the state after the formation of the Ta layer for forming the dielectric layer but before completion of the thin film capacitor device, in order to make the device structure more easily understood.

The thin film capacitor device 10 has an insulating substrate 1. The substrate 1 used herein is an ordinary printed substrate. Since the surface of the substrate 1 is coarse (surface coarseness Ra=2 to 3 $\mu$m), the thin film capacitor device 10 has a planarization layer 2 made of an epoxy resin in order to prevent the surface coarseness from being reflected on the upper thin layer and from exerting adverse influences on the device characteristics. The film thickness of this planarization layer is 20 $\mu$m. An epoxy resin is spin-coated to a predetermined thickness and is then set to form this planarization layer 2. Incidentally, the planarization layer can be omitted if the surface of the substrate 1 is flat and smooth.

The substrate used in this embodiment is not particularly limited. It may be an ordinary printed substrate (resin substrate) as described above, or a substrate made of the Cu-based metal. A suitable material of the resin substrate is an epoxy resin, a polyphenylene ether resin, or the like.

An adhesion layer 3 made of chromium (Cr) is disposed on the planarization layer 2 in order to improve adhesion strength between the substrate and the wiring layer. To form the Cr adhesion layer 3, a sputtering process, for example, can be employed, and its film thickness is 0.05 $\mu$m. The adhesion layer 3 may be made of NiCr, CrMo, or the like, in place of Cr, and the film thickness is generally within the range of 0.01 to 0.1 $\mu$m.

In the illustrated embodiment, a Cu wire is applied as the wiring layer 4. To form this Cu wire, Cu is deposited by the sputtering process to obtain a film thickness of 0.5 $\mu$m, for example, and Cu is further deposited on the former by electroplating to a larger thickness of 10 $\mu$m. Though materials other than Cu can be used for the wiring layer, the effects of the present invention can be obtained fully when the Cu wire is used.

The barrier layer 5 of the present invention is applied onto the Cu wiring layer 4. Titanium (Ti) is used for the material of the barrier layer. Sputtering, for example, can be used to form the Ti layer 5. The film thickness is about 0.3 $\mu$m. Because this layer exists, it prevents Cu of the wiring layer from diffusing into the Ta layer as its upper layer when the dielectric layer is formed by anodic oxidation of the Ta layer, and can drastically increase adhesion strength of the Ta layer to the substrate, as described previously.

The barrier layer will be explained hereby in further detail. The barrier layer can be made of various metal materials. Preferred metal materials for forming the barrier layer are the valve metals (or the metals having the valve function) that do not require heat-treatment at a high temperature, such as aluminum (Al), tantalum (Ta), niobium (Nb), tungsten (W), molybdenum (Mo), vanadium (V), bismuth (Bi), titanium (Ti), zirconium (Zr), hafnium (Hf) and silicon (Si). These valve metals may be used either alone or a mixture of two or more kinds of metals. These valve metals may be used in some cases in the form of compounds. Suitable examples of such compounds are nitrides (such as TiN, TaN, etc). Titanium (Ti) and TiN as its nitride, that are used in the embodiment shown in FIG. 2, can be used advantageously among a large number of these valve metals and their compounds. Such a layer can also function extremely excellently as an adhesion layer. The barrier layer may be made of the valve metals or their compounds described above, or a mixture of the valve metal compounds, a mixture of the valve metal compounds and the valve metals, a mixture of the valve metal compounds and other compounds, or the valve metal alloys. An example of the valve metal alloys is TiW.

A conventional film formation method used in the production process of semiconductor devices can be employed to form the barrier layer having a desired film thickness. Examples of suitable film formation methods are a vacuum deposition method, a sputtering method or a CVD method. The film formation conditions such as pressure, temperature, etc., can be changed arbitrarily depending on the desired effects and the desired film thickness.

The barrier layer is generally used as a single layer, but may have a multi-layered structure of two or more layers, whenever necessary. Examples of the multi-layered barrier layer include a two-layered structure of Ti+TiN and a two-layered structure of TiW+TiN. The film thickness of the barrier layer can be changed over a broad range depending on the desired effects in the same way as the film formation condition. Generally, however, the film thickness is preferably within the range of 10 μm to 5 μm. When the film thickness of the barrier layer is smaller than 10 nm, the effects of preventing diffusion of Cu and improving adhesion strength cannot be obtained. When the film thickness exceeds 5 μm, on the contrary, the resulting device becomes so thick that the functions of the device are likely to be affected due to the increase of the stress, and so forth. The film thickness of the barrier layer is further preferably within the range of 0.1 to 0.7 μm.

Though not shown in the drawing, the capacitor device of the present invention may include an intermediate layer between the barrier layer and the copper type wiring layer below the barrier layer, whenever necessary, so as to improve adhesion strength between them. A suitable example of the intermediate layer is a Cr layer.

Referring back again to FIG. 2, Ta as an anodic oxide metal is formed to a film thickness of 1.0 μm on the Ti layer 5. To form this Ta layer 6, the sputtering process, for example, can be employed in the same way as other layers.

The Ta layer 6 is subjected to anodic oxidation treatment to form the dielectric layer. Incidentally, the example shown in FIGS. 1A to 1E employs the structure wherein the Ti layer 5 covers the Cu wiring layer 4 lest the Cu wiring layer 4 comes into contact with the electrolyte during this anodic oxidation process. However, a resist material, etc, may be used to protect the Cu wiring layer 4.

Figure 3:
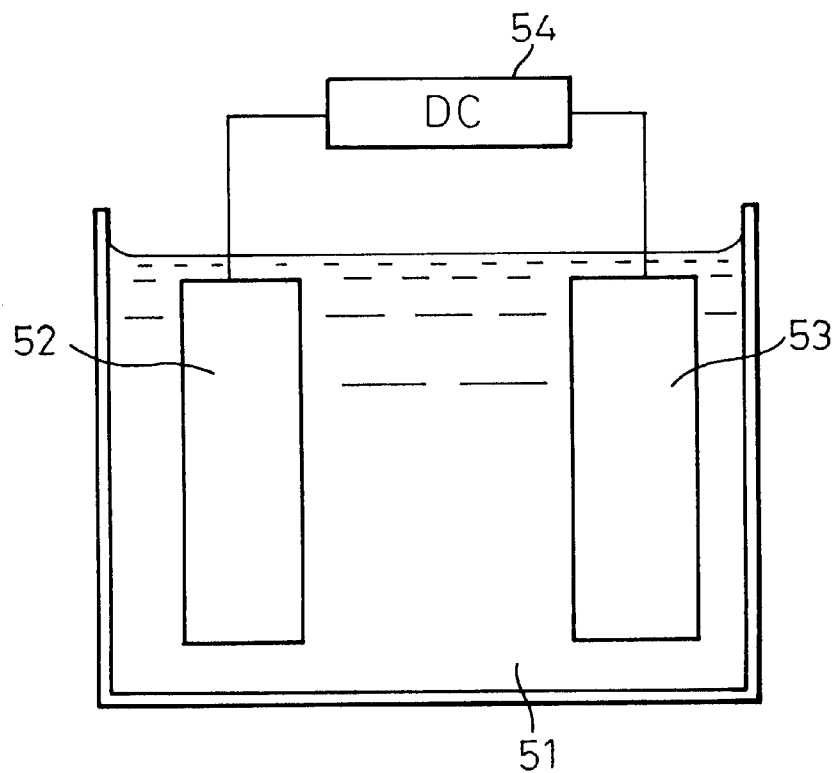
FIG. 3 is a sectional view showing an example of an anodic oxidation apparatus that can be used for the production of the capacitor device shown in FIG. 2.

To conduct the anodic oxidation process, an anodic oxidation apparatus typically shown in FIG. 3, for example, is employed. The electrolyte 51 uses a 0.01 to 1.0 wt % aqueous citric acid solution, for example. An anode 52 and a cathode 53 that are connected to a D.C. power source 54 are immersed in this electrolyte 51. The substrate having the anodic oxide metal, explained with reference to FIG. 2, is used for the anode 52, and a platinum (Pt) mesh, for the cathode 53. Oxidation is started first in a constant current mode of 0.1 to 10 mA/cm$^2$ in accordance with a constant current-constant voltage method shown in FIG. 4. As the formation time passes and a target voltage is reached, the mode is switched from the constant current mode to the constant voltage mode to further continue oxidation. Oxidation is conducted until the current value decreases to 1 to 10% as shown in the graph.

Figure 5:
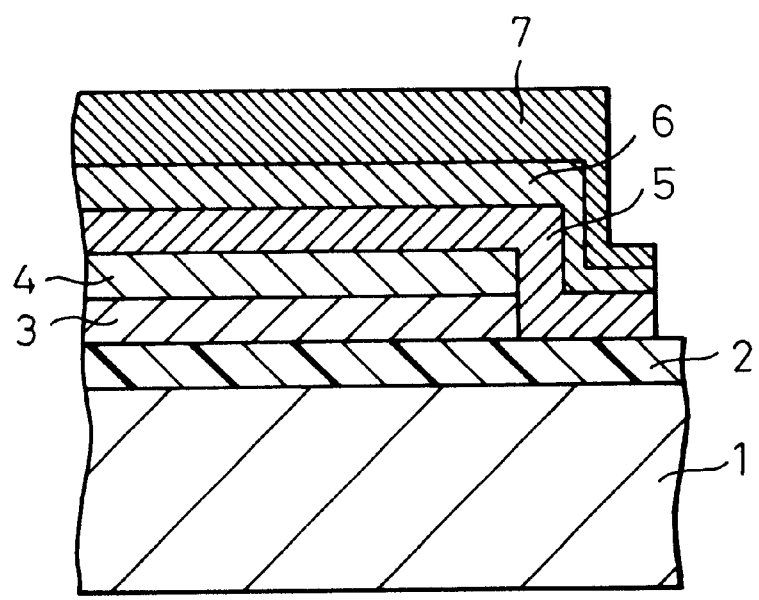
FIG. 5 is a sectional view showing the state of the capacitor device shown in FIG. 2 after anodic oxidation.

As a result of anodic oxidation described above, the surface portion of the Ta layer 6 as the uppermost layer of the substrate 1 is oxidized to a predetermined depth, giving a dielectric layer 7 consisting of tantalum pentoxide $Ta_2O_5$ as shown in FIG. 5. Subsequently, a conductive metal such as Au or Cu is sputtered to form an upper electrode, though it is not shown in the drawing. An adhesion layer of Ni, Cr, or the like, may be formed prior to the formation of the electrode in order to improve adhesion strength of the electrode of Au, Cu, etc.

The anodic oxidation process will be explained in further detail. When the Ta layer is directly laminated on the substrate having the planarization layer of the epoxy resin and this Ta layer is subjected to anodic oxidation by the constant current-constant voltage method, peeling of the Ta layer occurs on its interface with the epoxy resin layer when the film thickness of the Ta layer is 1.0 μm and the current density is less than about 10 mA/cm$^2$. When the substrate structure comprises the epoxy resin planarization layer/Ti layer/Ta layer as the Ti layer is sandwiched between the planarization layer of the epoxy resin and the Ta layer according to the present invention, however, peeling of the Ta layer does not occur even at a current density of less than about 10 MA/cm$^2$.

Figure 4:
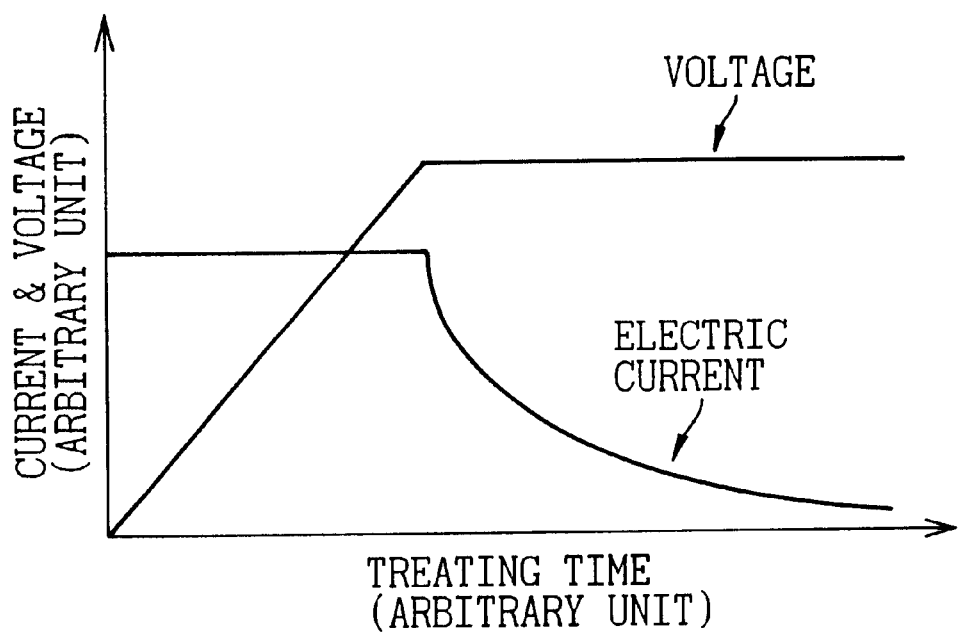
FIG. 4 is a graph explaining a constant current-constant voltage method employed in the anodic oxidation process.

Next, when the substrate structure comprises an epoxy resin planarization layer/Cr layer/Cu layer/Ta layer, for example, the sharp increase of the voltage shown in FIG. 4 cannot be obtained when the current is applied so as to conduct anodic oxidation. Moreover, Cu of the Cu layer diffuses and breaks through the upper Ta layer, dissolves in the electrolyte, and prevents the growth of the anodic oxide film ($Ta_2O_5$) at a low voltage of about 60 V irrespective of the current value. Incidentally, break-through of the Ta layer by Cu can be confirmed by the formation of very small through-holes in the Ta layer and the formation of concavo-convexities on its surface. When the substrate structure comprises the epoxy resin planarization layer/Cr layer/Cu layer/Ti layer/Ta layer according to the present invention, on the other hand, the voltage can be raised to a high level of at least 300 V, and diffusion of Cu can be checked by the Ti layer interposed between the Cu layer and the Ta layer with the result that the leakage current is small and a high-quality anodic oxide film can be formed.

The thin film capacitor device according to the present invention is equipped with the high-quality dielectric layer having the small leakage current, and can be therefore used advantageously as the capacitor for various applications. The capacitor device according to the present invention can exhibit its excellent functions particularly when it is built as a capacitor into a printed circuit substrate.

The basic structure of the printed circuit substrate according to the present invention may be the same as that of the conventional circuit substrates with the exception that it has the built-in thin film capacitor device of the present invention. Therefore, the printed circuit substrate of the present invention may include various printed circuit substrates. Among others, the printed circuit substrate of the present invention is preferably a printed circuit substrate having a built-up structure used for a semiconductor package.

Next, the production method of the printed circuit substrate according to the present invention will be explained. First, according to the present invention, the Ti-based metal is sputtered onto the printed substrate, to which the electric wire (Cu type metal) is applied, to form the barrier layer. Sputtering is then conducted to form the thin film of the Ta-based metal. The thin film of the Ta-based metal is then formed similarly by the sputtering method. Next, the Ta-based metal layer is subjected to anodic oxidation under a predetermined oxidation condition to form the dielectric layer. This anodic oxidation process can be conducted by the constant current-constant voltage method, for example. After the anodic oxide film is thus formed, the upper electrode is formed on this oxide film. To form the upper electrode, after a thin film of Cr, Ni, NiCr, or the like, is formed, an electrode metal such as gold (Au) or copper (Cu) is sputtered to form its film. In this way, the printed circuit substrate with the built-in thin film capacitor device is obtained. When the surface of the printed substrate is coarse, a resin such as an epoxy resin or a polyimide resin is spin-coated to planarize the substrate surface lest the surface coarseness exerts adverse influences (such as short-circuit between the elements) on the characteristics of the capacitor device. The capacitor device can be assembled into an arbitrary position on the circuit substrate. In the case of the printed circuit substrate having a built-up structure, for example, the capacitor device is assembled preferably in the proximity of the chip mounted. According to this construction, the effects such as restriction of the wiring resistance, the improvement of the frequency characteristics, etc., can be obtained.

In this specification, utilization of the thin film capacitor device according to the present invention has been explained with reference to the printed circuit substrate, in particular. It is to be understood, however, that the capacitor device can be applied to various other applications without departing from the scope of the present invention.

EXAMPLES

Hereinafter, examples of the present invention will be explained with reference to the accompanying drawings. It is to be noted, however, that the present invention is in no way limited by these examples.

FIGS. 6A to 6D show a thin film capacitor device according to a preferred embodiment of the present invention and also show, step-wise, its production process. Incidentally, the embodiment shown in the drawing employs the method that covers the full surface of the wiring layer with the barrier layer to prevent elution of Cu constituting the wiring layer into the electrolyte during the anodic oxidation process.

Figure 6A:
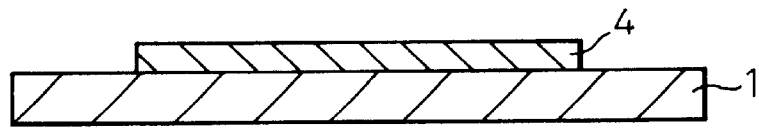
FIGS. 6A to 6D are sectional views showing, in sequence, a thin film capacitor device according to one preferred embodiment of the present invention and its production process.

First, as shown in FIG. 6A, a copper foil, for example, is pressed as a wiring conductor to a predetermined region on a printed substrate such as a resin substrate to form a copper wiring layer 4. This copper wiring layer 4 may be patterned by a photo-etching method, for example, whenever necessary. To mitigate concavo-convexities on the surface, the copper wiring layer 4 may be subjected to a so-called "soft etching" treatment or an electrolytic polishing treatment.

If the surface of the printed substrate has surface coarseness to an unallowable extent (for example, Ra=2 to 3 $\mu$m), it is preferred to first planarize the coarse surface and then to form the copper wiring layer. To planarize the surface concavo-convexities of the printed substrate in this case, a liquid resin such as an epoxy resin is preferably spin-coated to the substrate surface and is further set thermally in the open air at 200° C. for about 2 hours. After this planarization treatment is completed, Cr and Cu are serially sputtered to film thickness of 0.05 $\mu$m and 0.5 $\mu$m, respectively. Subsequently, electrolytic plating of Cu is made to a film thickness of 15 $\mu$m to complete the copper wiring layer. When the substrate surface is planarized in this way, a thin film capacitor device having high yield and high reliability can be produced even when the dielectric layer deposited to the copper wiring layer is thin.

Figure 6B:
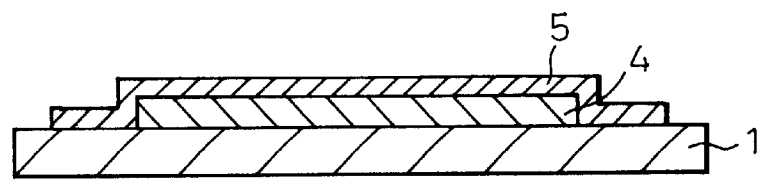

Next, the barrier layer according to the present invention is formed on the copper wiring layer in order to let it function as a barrier for preventing diffusion of copper from the copper wiring layer. This process step is carried out as Ti is deposited to the surface of the copper wiring layer 4 over the substrate 1 by sputtering or CVD in such a fashion as to cover the entire surface of the copper wiring layer 4 as shown in FIG. 6B. In the embodiment shown in this drawing, the film thickness of the resulting barrier layer (Ti layer) 5 is about 100 nm. Needless to say, the film thickness of the barrier layer must be adjusted suitably in accordance with the concavo-convexities of the substrate as the base but realistically, it is from about 50 nm to about 1 $\mu$m. The main function to be achieved by the barrier layer is to prevent Cu from diffusing and dissolving into the electrolyte. Therefore, the barrier layer becomes meaningless unless it is so formed as to completely cover the end portions of the copper wiring layer. The barrier layer has also the function of preventing the drop of adhesion power of the Ta layer to the substrate when the planarization resin layer such as the epoxy resin is applied to planarize the substrate surface.

Figure 6C:
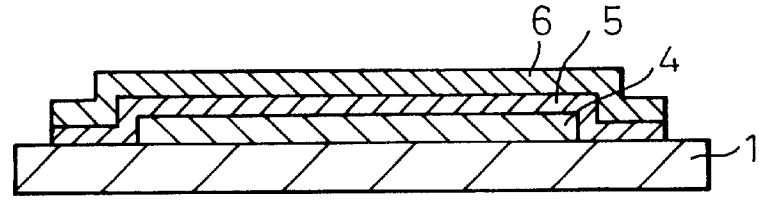

After the formation of the barrier layer is completed, a Ta layer 6 as a layer that is to be converted to an anodic oxide layer is formed as shown in FIG. 6C. The Ta layer 6 can be formed to a film thickness of 500 nm by sputtering or CVD. Needless to say, the film thickness of this Ta layer must be adjusted suitably in accordance with the concavo-convexities of the substrate as the base in the same way as the barrier layer described above. The film thickness that is realistically desirable is from about 100 nm to about 2 $\mu$m. When the Ta layer is formed, consideration need not be paid so as to completely cover the end portions of the copper wiring layer by this Ta layer.

Figure 6D:
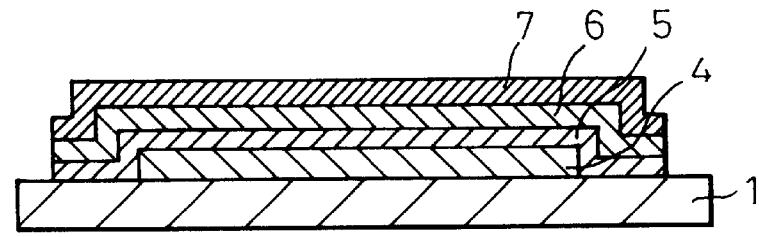

Finally, anodic oxidation of the Ta layer is conducted to form an anodic oxide film ($Ta_2O_5$) 7 as shown in FIG. 6D. This anodic oxidation step can be carried out in the same way as explained previously with reference to FIGS. 3 and 4. First, a 0.1% sodium citrate solution, for example, is prepared as the electrolyte. The substrate equipped with the Ta layer formed in the preceding step is then connected to the anode. Oxidation is conducted at a constant current of 10 $mA/cm^2$ to 200 V as a formation voltage. At this time, the formation voltage must of course be adjusted in accordance with the concavo-convexities of the substrate as the base. The formation voltage that is realistically desirable is generally from about 100 to about 400 V.

FIGS. 7A to 7D show a thin film capacitor device according to another preferred embodiment of the present invention, and also shows step-wise its production process. The embodiment shown in this drawing employs the method that covers the end portions of the wiring layer with a photo-resist so as to prevent elution of Cu constituting the wiring layer into the electrolyte during the anodic oxidation process.

Figure 7A:
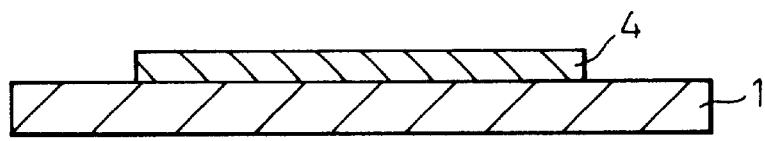
FIGS. 7A to 7D are sectional views showing, in sequence, a thin film capacitor device according to another preferred embodiment of the present invention and its production process.

First, as shown in FIG. 7A, a copper foil, for example, is pressed as a wiring conductor to a predetermined region on a printed substrate 1 such as a resin substrate to form a copper wiring layer 4. The copper wiring layer 4 may be patterned by a photo-etching method, for example, whenever necessary. Furthermore, the copper wiring layer 4 may be subjected to so-called "soft etching" treatment so as to mitigate the concavo-convexities on its surface. If the surface of the printed substrate has surface roughness to an unallowable extent, though not shown in the drawing, the copper wiring layer is preferably formed after such a rough substrate surface is planarized by the means explained previously with reference to FIG. 6.

Figure 7B:
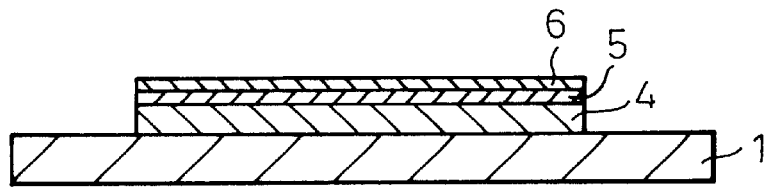

After the copper wiring layer 4 is formed in this way, a barrier layer 5 according to the present invention is formed on this copper wiring layer 4. The barrier layer 5 is expected to function as a barrier that prevents diffusion of copper from the copper wiring layer and its dissolution into the electrolyte as explained previously. The formation step of the barrier layer 5 can be conducted by depositing Ti by sputtering or CVD to the surface of the copper wiring layer 4 over the substrate 1 as shown in FIG. 7B. In the embodiment shown in the drawing, the film thickness of the resulting barrier layer (Ti layer) 5 is about 100 nm. Incidentally, the film thickness of the barrier layer, that is realistically desirable, is from about 50 nm to about 1 $\mu$m. This barrier layer functions also to improve adhesion power of the Ta layer to the substrate when a planarization resin layer such as the epoxy resin is applied to planarize the substrate surface.

A Ta layer 6, for example, is formed as a metal oxide to be anodically oxidized, subsequent to the formation of the barrier layer. Sputtering or CVD can be used to form the Ta layer to a film thickness of 500 nm, for example. The film thickness of this Ta layer must be of course adjusted suitably in accordance with the concavo-convexities of the substrate as the base in the same way as the film thickness of the barrier layer described above but the film thickness that is realistically desirable is from about 100 nm to about 2 μm.

Figure 7C:
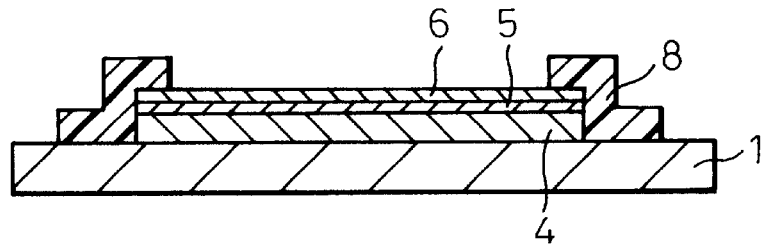

When the barrier layer is formed, it is basically meaningless unless the barrier layer covers completely the end portions of the copper wiring layer. However, there is the case where the barrier layer cannot cover and seal the end portions of the copper wiring layer from the aspect of design and/or the production process. In such a case, it is recommended to seal the end portions of the copper wiring layer 4 with a resist film 8 as shown in FIG. 7C. Sealing by the resist film can be carried out, for example, by spin-coating a solution of an insulating photo-resist to the entire surface of the copper wiring layer, curing the resulting photo-resist film and selectively removing the photo-resist film from the portions other than the seal portion; It is also possible to use a dry film or an adhesive polyimide tape in place of such a photo-resist.

Figure 7D:
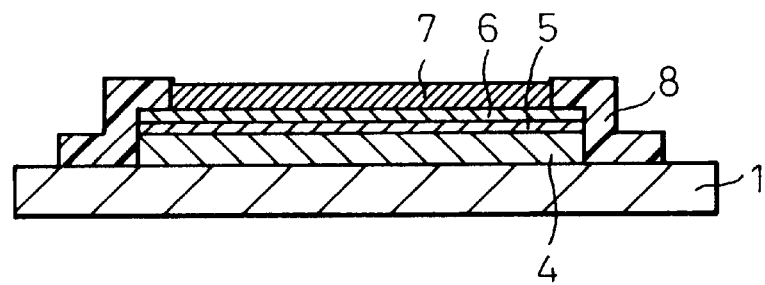

After the end portions of the copper wiring layer 4 are sealed with the resist film 8, the Ta layer 6 is subjected to anodic oxidation to form an anodic oxide film ($Ta_2O_5$) 7 as the dielectric layer as shown in FIG. 7D. This anodic oxidation step can be carried out in the way explained previously with reference to FIGS. 3 and 4. For example, a 0.1% sodium citrate solution is prepared as the electrolyte, and the substrate with the Ta layer fabricated in the previous step is connected to the anode. Oxidation is conducted at a constant current of 10 mA/cm$^2$ to a formation voltage of 200 V. The formation voltage that is realistically desirable in this case is generally from 100 to 400 V. Needless to say, this formation voltage must be adjusted suitably in accordance with the concavo-convexities of the substrate as the base.

In the illustrated embodiment, the anodic oxidation region of the Ta layer 6 depends on, and is determined by, the formation portion of the resist film 8 that seals the end portions of the copper wiring layer 4. Accordingly, the present invention can selectively form the dielectric layer in only a suitable region of the Ta layer 6 by changing suitably the arrangement pattern of the sealing resist film 8. Incidentally, the resist film 8 can be removed after anodic oxidation because it is no longer necessary.

Figure 8:
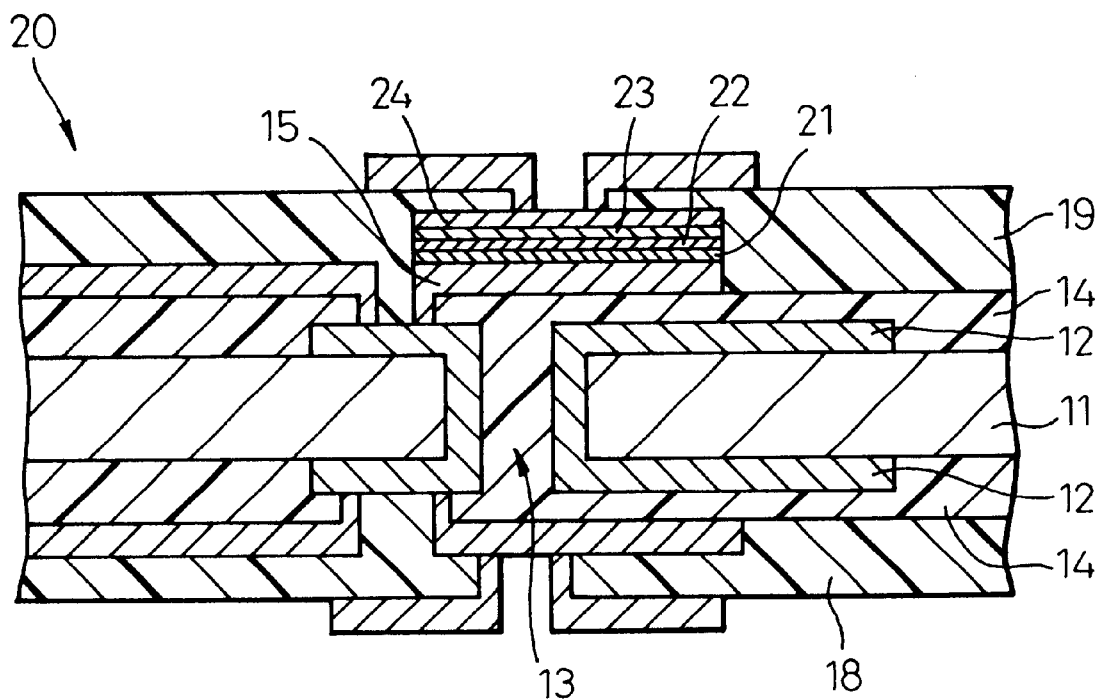
FIG. 8 is a sectional view showing a built-up wiring substrate according to a preferred example of the printed circuit substrate of the present invention.

FIG. 8 shows a printed circuit substrate having a built-up structure as a preferred embodiment of the printed circuit substrate with the built-in capacitor according to the present invention, that is, a built-up wiring substrate. The built-up wiring substrate comprises the basic constituent elements of the conventional printed circuit substrate, but is characterized in that a wiring layer is formed in a high density over its surface portion. Therefore, this wiring substrate provides the effect that a high-density and compact wiring substrate can be fabricated at a lost cost of production.

The built-up wiring substrate 20 shown in the drawing includes a printed substrate 11 and a through-hole 13 formed at its predetermined portion. A wiring conductor layer 12 (using copper wire in this embodiment) is deposited in a predetermined pattern to the surface of the printed substrate 11 and to the inner surface of the through-hole 13. The thin film capacitor device according to the present invention, that is, the laminate structure comprising the Cu layer 15 as the lower electrode, the Ti layer 21 as the barrier layer, the Ta layer 22 as the layer to be anodically oxidized, the $Ta_2O_5$ layer 23 as the anodic oxide layer (dielectric layer) and the Cr/Cu layer 24 as the upper electrode, is assembled onto the through-hole 13. Inter-layer insulating films 14, 18 and 19 made of an insulating resin are interposed between the wiring conductors that are adjacent to one another in the vertical direction. The insulating resin used hereby is the epoxy resin, but other resins such as a polyimide resin can be used, too. Incidentally, the built-up wiring substrate 20 shown in the drawing represents an example of the laminate comprising high-density wiring layers (built-up layers) having a simple structure on the printed substrate 11 in order to allow the present invention to be easily understood. Therefore, it is naturally possible to dispose high-density wiring layers having various structures to execute the present invention.

The production method of the built-up wiring substrate 20 shown in FIG. 8 is not exactly the same as that of the wiring substrate, but can be easily understood from FIGS. 9A to 9H showing step-wise the production process of the printed circuit substrate according to another preferred embodiment of the present invention that is analogous to the built-up substrate.

Figure 9A:
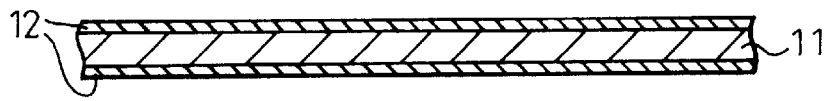
FIGS. 9A to 9H are sectional views showing a built-up wiring substrate according to another preferred embodiment of the present invention, and its production process, in sequence.
Figure 9B:
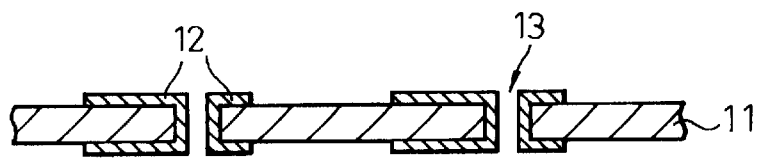

First, a copper foil 12 is pressed to both surfaces of the printed substrate 11 prepared as shown in FIG. 9A.

Next, a through-hole 13 is bored at a predetermined portion of the printed substrate 11. A laser process can very delicately and accurately bore the through-hole 13. Copper is plated by electroless plating or electroplating subsequent to the formation of the through-hole 13, and the resulting copper layer is patterned so as to remove its unnecessary portions. There is thus obtained a copper wiring layer 12 having a sectional shape shown in FIG. 9B.

Figure 9C:
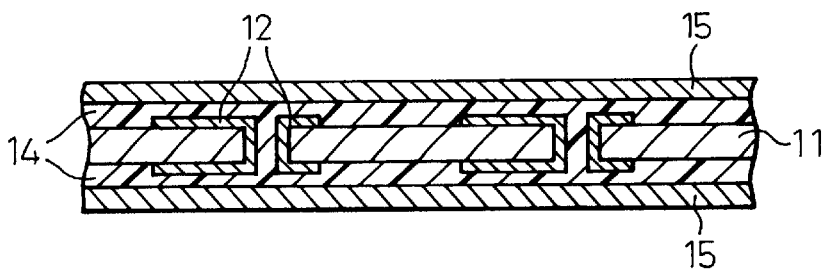

After processing of the through-hole 13 is complete, an insulating resin layer 14 is formed on both surfaces of the printed substrate 11 (an insulating epoxy resin is used in this embodiment), and sputtering is then conducted to form a Cr/Cu layer on the insulating resin layer 14. Electroplating of copper is conducted further. In this way, the sectional shape comprising the laminate of the insulating layer 14 and the copper layer 15 over the printed substrate 11 can be obtained as shown in FIG. 9C.

Figure 9D:
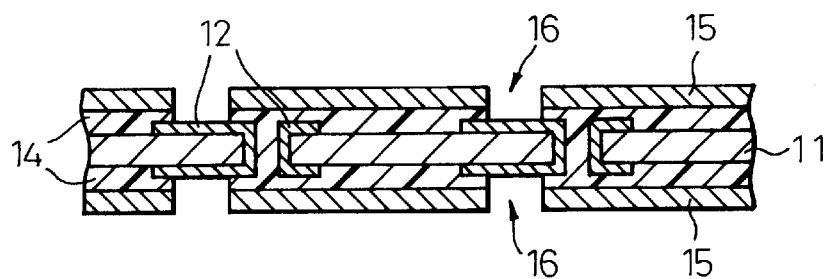

Next, via-holes 16 are formed at predetermined portions of the copper layer 15 as shown in FIG. 9D. Customary means such as laser processing can be used to form the via-holes 16.

Figure 9E:
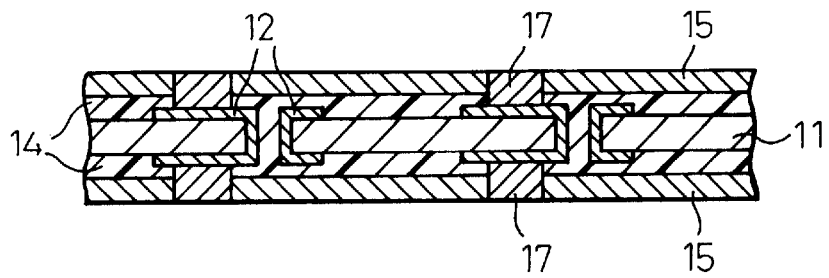

Subsequent to the formation of the via-holes 16, as shown in FIG. 9E, electroless plating or electroplating of copper is conducted in such a fashion as to bury the via-hole portions 17, too, by the copper plating 17.

Figure 9F:
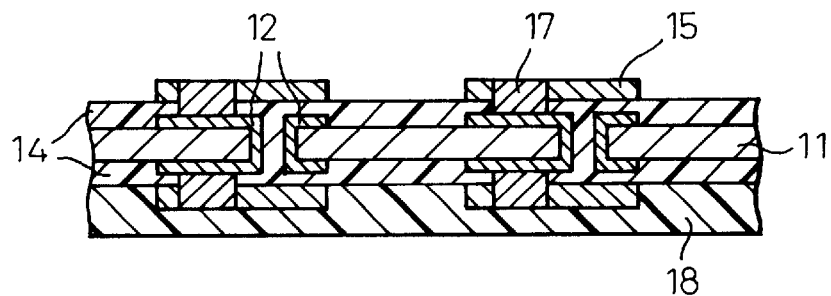

Subsequent to copper plating of the via-hole portions, patterning of the copper layer 15 formed on the surface of the printed substrate 11 by copper plating is conducted as shown in FIG. 9F. The copper layer at portions other than the capacitor portion is removed selectively. In this instance, the steps of FIGS. 9C to 9F described above may be repeated so as to form a multi-layered wiring structure having a greater number of layers. After the copper layer is removed selectively to form the copper wiring layer 15, an insulating resin layer 18 is formed. In this case, too, insulating epoxy resin is used.

Figure 9G:
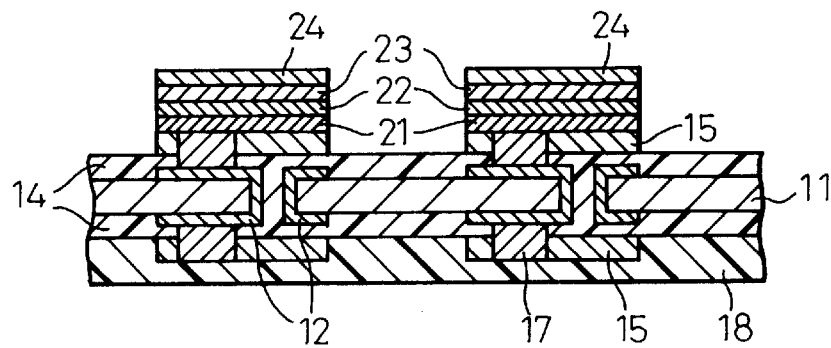

After the copper wiring layer (lower electrode) is formed at the capacitor portion, the thin film capacitor device according to the present invention is laminated on this lower electrode. Lamination of this thin film capacitor device can be conducted in the same way as explained previously with reference to FIGS. 6A to 6D and FIGS. 7A to 7D. The outline of the lamination method is as follows. The Ti layer 21 as the barrier layer is deposited by the sputtering or CVD process in such a fashion as to cover the entire surface of the copper wiring layer 15. Next, the Ta layer 22 as the metal layer to be anodically oxidized is deposited similarly, onto the entire surface, by the sputtering or CVD process. Subsequently, the Ta layer 22 is subjected to anodic oxidation to form the anodic oxide film ($Ta_2O_5$ layer) 23 as the dielectric layer. Cr/Cu sputtering and electrolytic plating of Cu are conducted further on the dielectric layer 23 thus formed so as to form the copper wiring layer (upper electrode) 24. After the laminate structure of Ti/Ta/$Ta_2O_5$/Cr/Cu extending over the substrate 11 is thus formed, the portions of the laminate structure other than the capacitor are etched away in accordance with the photolithographic process. There is thus obtained the capacitor of the present invention as shown in FIG. 9G. In this capacitor, copper of the copper wiring layer 15 of the base does not dissolve in the electrolyte for anodic oxidation. Consequently, no defects occur in the capacitor characteristics, and peel of the Ta layer 22 does not occur, either.

Figure 9H:
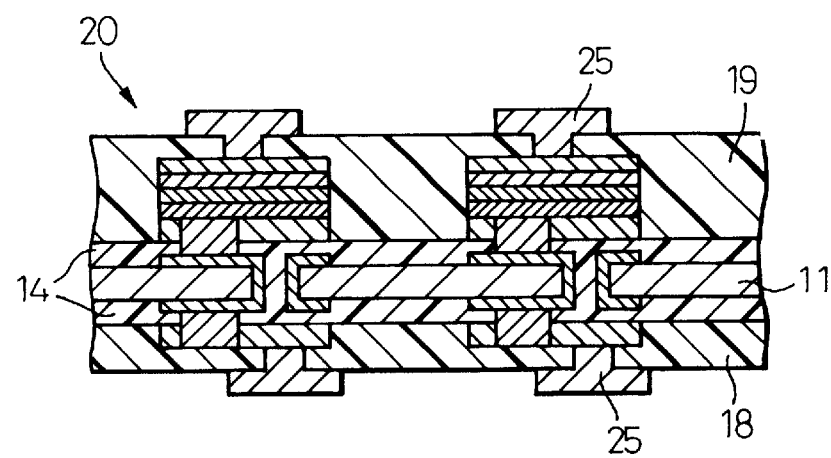

The insulating resin layer 19 is formed subsequently to the formation of the capacitor by a method similar to the method explained previously with reference to the steps of FIGS. 9D to 9F. Next, the formation of the via-holes by the laser processing, electroless plating or electroplating of copper and patterning of the copper plating layer are carried out giving, thereby, the built-up wiring substrate 20 of the present invention having the copper wiring layer 25 exposed on the surface thereof as shown in FIG. 9H.

As described above in detail, the present invention can provide an improved Ta-based thin film capacitor device free from drops in reliability and yield, an increase of a leakage current, peeling of a Ta thin film, etc., that are the problems resulting from anodic oxidation employed in a production process. The present invention can improve much more remarkably the adhesion strength between the Ta thin film and the substrate as the base than in the prior art capacitor devices. Furthermore, the present invention can provide a printed circuit substrate capable of fully exploiting the excellent characteristics of such a capacitor device. Therefore, the present invention can be utilized advantageously for the production of semiconductor devices and the like.

What is claimed is:

1. A thin film capacitor device comprising:
    a wiring layer made of a copper-based low resistance metal;
    a dielectric layer made of an anodic oxide of a tantalum-based metal formed on said wiring layer; and
    a barrier layer comprising at least one kind of a valve metal selected from the group consisting of aluminum, niobium, tungsten, molybdenum, vanadium, bismuth, titanium, zirconium, hafnium and silicon, a compound of said valve metal, a mixture of said valve metal compounds, a mixture of said valve metal compound and said valve metal, and an alloy of said valve metal, said barrier layer being interposed between said wiring layer and said tantalum-based metal.

2. A thin film capacitor device according to claim 1, wherein said barrier layer is formed either immediately above said wiring layer, or over said wiring layer through an intermediate layer.

3. A thin film capacitor device according to claim 1 or 2, wherein said barrier layer comprises a single layer or a multi-layered structure of two or more layers.

4. A thin film capacitor device according to claim 1 or 2, wherein said wiring layer is formed over an insulating substrate having applied thereon a resin layer for planarizing unevenness of a surface of said insulating substrate.

5. A thin film capacitor device according to claim 1 or 2, wherein said barrier layer is made of at least one of elements selected form the group consisting of titanium, a titanium alloy, and a nitride thereof.

6. A printed circuit substrate having a thin film capacitor device built therein as a capacitor, said thin film capacitor device comprising a wiring layer made of a copper-based low resistance metal,
    a dielectric layer made of an anodic oxide of a tantalum-based metal formed on said wiring layer, and
    a barrier layer comprising at least one kind of a valve metal selected from the group consisting of aluminum, niobium, tungsten, molybdenum, vanadium, bismuth, titanium, zirconium, hafnium and silicon, a compound of said valve metal, a mixture of said valve metal compounds, a mixture of said valve metal compound and said valve metal, and an alloy of said valve metal, said barrier layer being interposed between said wiring layer and said tantalum-based metal.

7. A printed circuit substrate according to claim 6, wherein said capacitor is built in a multi-layered circuit substrate having a built-up structure.

8. A printed circuit substrate according to claim 6, wherein said barrier layer is formed either immediately above said wiring layer through an intermediate layer.

9. A printed circuit substrate according to claim 6 or 8, wherein said barrier layer comprises a single layer or a multi-layered structure of two or more layers.

10. A printed circuit substrate according to claim 6 or 8, wherein said wiring layer is formed over an insulating substrate having applied thereon a resin layer for planarizing unevenness of a surface of said insulating substrate.

11. A printed circuit substrate according to claim 6 or 8, wherein said barrier layer is made of at least one of elements selected from the group consisting of titanium, a titanium alloy, and a nitride thereof.

12. A thin film capacitor device comprising a substrate made of a copperbased low resistance metal, a dielectric layer made of an anodic oxide of a tantalum-based metal formed on said substrate, and a barrier layer comprising at least one kind of a valve metal selected from the group consisting of aluminum, niobium, tungsten, molybdenum, vanadium, bismuth, titanium, zirconium, hafnium and silicon, a compound of said valve metal, a mixture of said valve metal compounds, a mixture of said valve metal compound and said valve metal, and an alloy of said valve metal, said barrier layer being interposed between said substrate and said tantalum-based metal.

13. A printed circuit substance having a thin film capacitor device built therein as a capacitor, said thin film capacitor device comprising a substrate made of a copper-based low resistance metal, a dielectric layer made of an anodic oxide of a tantalum-based metal formed on said substrate, and a barrier layer comprising at least one kind of a valve metal selected from the group consisting of aluminum, tantalum, niobium, tungsten, molybdenum, vanadium, bismuth, titanium, zirconium, hafnium and silicon, a compound of said valve metal, a mixture of said valve metal compounds, a mixture of said valve metal compound and said valve metal, and an alloy of said valve metal, said barrier layer being interposed between said substrate and said tantalum-based metal.

* * * * *

UNITED STATES PATENT AND TRADEMARK OFFICE
CERTIFICATE OF CORRECTION

PATENT NO. : 6,498,714 B1
DATED : December 24, 2002
INVENTOR(S) : Akira Fujisawa, Akihito Takano and Masayuki Sasaki It is certified that error appears in the above-identified patent and that said Letters Patent is hereby corrected as shown below:

Column 12,
Line 26, after "wiring layer" insert -- , or over said wiring layer --.

Signed and Sealed this

Twenty-ninth Day of July, 2003

JAMES E. ROGAN
*Director of the United States Patent and Trademark Office*